United States Patent [19]

O'Toole et al.

[11] 4,370,405

[45] Jan. 25, 1983

[54] MULTILAYER PHOTORESIST PROCESS UTILIZING AN ABSORBANT DYE

[75] Inventors: Michael M. O'Toole, San Jose; En-Den D. Liu, Mountain View; Mark S. Chang, Sunnyvale, all of Calif.

[73] Assignee: Hewlett-Packard Company, Palo Alto, Calif.

[21] Appl. No.: 248,927

[22] Filed: Mar. 30, 1981

[51] Int. Cl.$^3$ .............................................. G03C 5/00
[52] U.S. Cl. .................................. 430/312; 430/313; 430/316; 430/396
[58] Field of Search ............... 430/311, 312, 313, 316, 430/326, 396; 156/643, 668, 661

[56] References Cited

U.S. PATENT DOCUMENTS

| | | | |
|---|---|---|---|
| 1,655,127 | 1/1928 | Beebe | 430/323 |
| 3,751,248 | 8/1973 | Goell | 430/312 |
| 4,102,683 | 7/1978 | Di Piazza | 430/319 |
| 4,126,466 | 11/1978 | Roos | 430/271 |
| 4,259,433 | 3/1981 | Mizobuchi et al. | 430/323 |

FOREIGN PATENT DOCUMENTS 54-109423  8/1979  Japan ..................... 430/292

*Primary Examiner*—Mary F. Downey
*Attorney, Agent, or Firm*—John A. Frazzini

[57] ABSTRACT

An improved photoetch technique is presented of the multilayer resist type wherein a thin top layer of resist and a thick planarizing layer are deposited on a substrate and the thin layer is exposed and developed to produce a patterned resist layer. The improvement involves dissolving a suitable dye in a layer between the thin top layer and the substrate. The dye is preferably selected to absorb light of the wavelengths used to expose the top layer but does not interfere with processing of the other layers.

3 Claims, 4 Drawing Figures

MULTILAYER PHOTORESIST PROCESS UTILIZING AN ABSORBANT DYE

BACKGROUND OF THE INVENTION

This invention relates generally to photoresist processes for etching semiconductor devices and particularly to a multilevel photoresist process utilizing an absorbant dye to improve line resolution and uniformity.

In integrated circuit technology, significant effort has been expended on increasing the resolution of photoresist processes because greater resolution enables a greater number of circuits to be placed on a single chip. This increase in circuit density increases the potential complexity and speed of the resulting integrated circuit.

Present techniques in optical projection printing can resolve 1 micron lines in photoresist with good linewidth control when flat, low reflectivity substrates are used. However, when exposing resist on substrates with surface topography, there are resist control problems introduced by optical reflections and by resist thickness non-uniformity.

Reflection of light from the substrate-resist interface produces variations in the light intensity in the resist during exposure resulting in non-uniform linewidth. Light can scatter from the interface into regions of the resist where no exposure was intended resulting in a broadening or blooming of the linewidth. The amount of scattering and reflection will typically vary from region to region resulting in linewidth non-uniformity.

To eliminate the effects of chromatic aberration, monochromatic or quasi-monochromatic light is commonly used in resist projection printing techniques to expose the resist. Unfortunately, the effects of interface reflections on resolution is particularly significant when monochromatic or quasi-monochromatic light is used to expose the resist. When such light reflects from the substrate-resist interface, the reflected light interferes with the incident light to form standing waves within the resist. In the case of highly reflective substrate regions, the standing wave effect is more pronounced. Part of the reflected light also reflects back to the substrate from the top surface of the resist. Such multiple reflection of the incident light between the top and bottom surfaces of the resist layer results in a resonance affecting the light intensity within the resist. The time required to expose the resist is generally an increasing function of resist thickness because of the increased total amount of light required to expose an increased amount of resist. However, because of the resonant effect, the time of exposure also includes a harmonic component which varies between successive maximum and minimum values as the resist thickness varies through a quarter wavelength of the incident light. If the resist thickness is non-uniform, there will be a non-uniform exposure resulting in variable linewidth control.

The photoresist linewidth control problems due to scattering and reflection from the substrate-resist interface can be solved by reducing or eliminating the substrate reflection. In one prior proposal (H. A. Koury and K. V. Patel, "Anti-Interference Phenomena Coating", IBM Technical Disclosure Bulletin, Vol. 13, No. 1, page 38, June 1970) a thin ultraviolet light absorbing layer containing a dye such as methyl orange or methanil yellow is deposited at the substrate-resist interface.

Linewidth control problems also arise from substrate topography. As indicated above, the resonance effect and resist thickness variation can combine to produce linewidth nonuniformity. In addition, when a layer of resist is exposed and developed, the resulting resist pattern will typically have sloping walls so that the width of the resist pattern at the surface of the substrate will vary with the resist thickness. Because a layer of material deposited on a non-flat surface will inherently vary in thickness, substrate topography will produce linewidth control problems. The problems due to substrate surface topography are addressed in the tri-level technique disclosed in the article by J. M. Moran and D. M. Maydan, J. Vac. Sci. Technol., 16, 1620 (1979) and the article by J. H. Bruning, J. Vac. Sci. Technol., 17, 1147 (1980). In that technique a thick bottom layer (2–3 micron) of Hunt positive resist is deposited on the substrate to produce a planar surface on which a thin (0.1 micron) layer of a silicon dioxide is deposited. A thin (0.5 micron) top resist layer is spun onto the silicon dioxide layer. The top resist is then exposed (e.g. by a projection printing technique using ultraviolet light or x-ray exposure) and developed. The intermediate silicon dioxide layer and the bottom layer are delineated by a reactive ion etching process.

SUMMARY OF THE INVENTION

In accordance with the preferred embodiment illustrated in FIGS. 1–4 a modified multilevel resist technique is disclosed. In FIG. 1 is shown a substrate on which a metal interconnect has been deposited. Metal interconnects present one of the biggest obstacles to good linewidth resolution in subsequent resist pattern development because such interconnects not only produce problems due to surface topography but also produce local regions of high reflectivity. The substrate is covered with a bottom layer of material of sufficient thickness (approximately 1.5 micron) to produce a planar top surface. A thin (approximately 0.1 micron) silicon nitride layer is deposited on top of the planar surface. A thin (0.5 micron) top layer of resist is then coated onto the composite.

The light used to expose the top resist layer can be selected to be monochromatic or quasi-monochromatic to avoid chromatic aberration. The resist in the top layer and material in the bottom layer should have nearly equal index of refraction at this wavelength to avoid reflecting the light from the interface between the top and bottom layers. As a result of the thin planar character of the top layer the light which is projected through a mask onto the top layer by standard projection printing techniques, exposes the top layer with sharply focussed light.

A dye is included in the bottom layer to reduce or eliminate resolution problems due to interface reflections. The dye in the bottom layer is selected to absorb significantly in the range of wavelengths used to expose the top resist layer and is sufficiently concentrated to reduce the problems due to substrate-resist interface reflections to an acceptable level. The dye must therefore be sufficiently soluble in the material in the bottom layer to allow this level of concentration to be achieved. In addition the dye must not lose its absorptive properties even after subjection to the bake temperatures used for the top resist layer. The dye should also not crystallize before exposure of the resist layer since that would produce nonuniform and potentially incomplete absorption. The dye should also be substantially transparent at some point within the visible wavelength range to facilitate alignment during projection printing. The dye must also not contain elements such as sodium and potassium which can contaminate the integrated circuit.

DESCRIPTION OF THE PREFERRED EMBODIMENT

Figure 1:
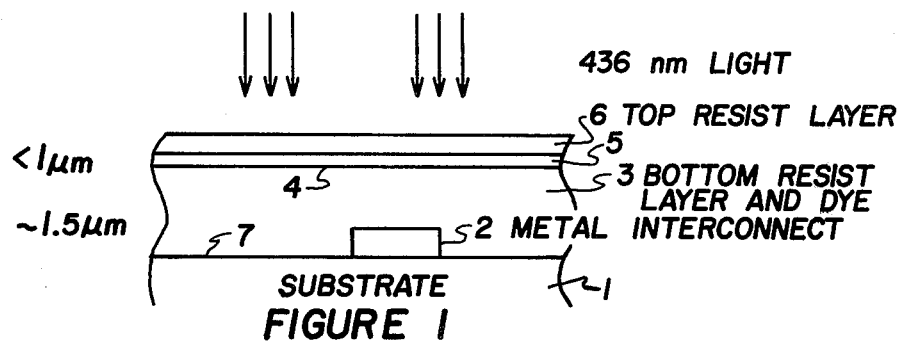
FIG. 1 illustrates the top layer exposure step of a process in accordance with the disclosed invention.

In FIGS. 1-4 a tri-level resist technique is disclosed which utilizes an absorbing dye to reduce or eliminate problems caused by reflections from the surface of the substrate. A bottom layer 3 of Hunt 204 positive resist (available from Philip A. Hunt Chemical Corp., P.O. Box 800, Palisades Park, N.J. 07650) containing 1.5% by weight Coumarin 314 dye (available from Exciton Chemical Company, Inc., P.O. Box 3204, Overlook Station, Dayton, Ohio 45431) is deposited on a substrate 1 having a metal interconnect 2. The bottom layer is sufficiently thick (1-3 microns) to produce a substantially planar top surface 4. The bottom layer is baked for 30 minutes at 160° C. and then a thin (0.1 micron) intermediate layer 5 of silicon nitride is deposited by plasma enhanced chemical vapor deposition at room temperature. A thin (0.5 micron) top layer 6 of Hunt MPR positive resist (available from Philip A. Hunt Chemical Corp.) is deposited on top of the silicon nitride layer. The top layer is baked for 5 minutes at 110° C. before exposure of the top layer.

FIG. 1 illustrates the processing step in which the top layer 6 is exposed by 436 nm light from a GCA 4800 DSW Direct Step on the Wafer System (available from GCA/Burlington Division, 174 Middlesex Turnpike, Burlington, Mass. 01803). At an exposure energy density of 30 mJ/cm$^2$ the Coumarin 314 dye is sufficiently concentrated in the bottom layer and is sufficiently absorptive at the 436 nm wavelength that approximately 95% of the light entering a 1.5 micron bottom layer is absorbed in a single pass through that layer. This degree of absorption is sufficient to effectively eliminate the resolution reduction caused by reflection from the surface 7 of substrate 1. The bottom layer is also sufficiently planar that the top layer is exposed by sharply focussed light to produce the desired pattern.

Figure 2:
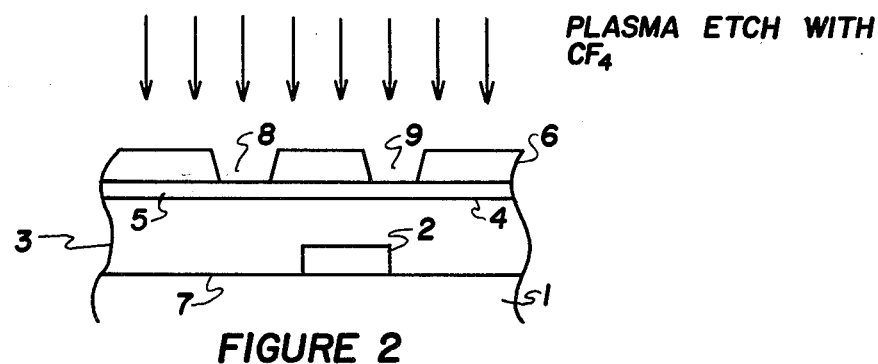
FIG. 2 illustrates the intermediate layer etch step of a process in accordance with a preferred embodiment of the disclosed invention.
Figure 3:
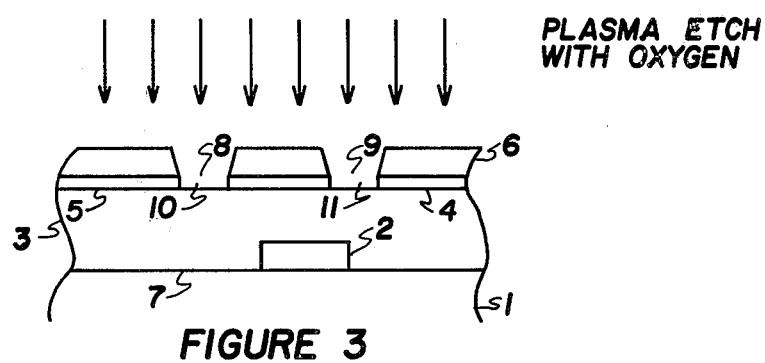
FIG. 3 illustrates the bottom layer etch step of a process in accordance with a preferred embodiment of the disclosed invention.
Figure 4:
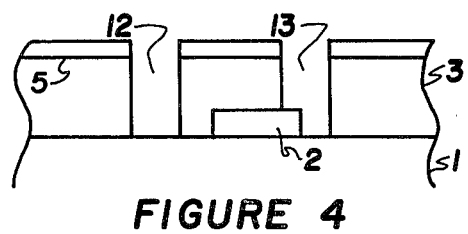
FIG. 4 shows the resist pattern which results from the process steps of FIGS. 1-3.

After exposure of the top layer 6, the top layer is developed in a spray developer with a 2:1 dilution with deionized water of AZ MF312 (available from Shipley Company, Inc., 2300 Washington St., Newton, Mass. 02162). In FIG. 2, the pattern is replicated in the silicon nitride layer 5 by plasma etching layer 5 in regions 10 and 11 through the developed regions such as regions 8 and 9 in the top resist layer 6 with CF$_4$ at 0.1 W/cm$^2$rf power density and 4 millitorr. The intermediate layer 5 serves as a reactive ion etch shield for transfer of the pattern to the bottom layer 3. In FIG. 3 the pattern in the intermediate layer 5 is transferred to bottom layer 3 in regions 12 and 13 by an oxygen reactive ion etch process. At a 0.1 W/cm$^2$rf power density and 4 millitorr pressure a 50 nm/min etch rate is obtained resulting in minimal undercut. The structure resulting from this plasma etch step is shown in FIG. 4. In alternate embodiments of this process, if materials are used in the top and bottom layers which have a sufficiently large differential dry etch rate, the intermediate layer 5 of silicon nitride can be omitted without significant loss of resolution.

We claim:

1. An improved process of photoetching a substrate having surface topography, of the type wherein a first material is deposited over the substrate to produce a planarizing layer which is thick enough that it has a substantially planar top surface in spite of the underlying topography, a resist is deposited above the planarizing layer to form a resist layer thereby producing a multilayer substrate coating having the planarizing layer sandwiched between the substrate and the resist layer, the resist layer is exposed to light in a range in which the resist is sensitive, said light having been passed through a mask to expose only selected portions of the resist layer, the resist layer is developed to produce a pattern, and the layers of the substrate coating between the resist layer and the substrate are processed to replicate the pattern in such layers, the improvement comprising:

selecting a dye which strongly absorbs light at the wavelengths used to expose the resist layer; and dissolving the dye in a layer which is sandwiched between the substrate and the resist layer.

2. A process as recited in claim 1 wherein the pattern of the resist layer is replicated in the layers between the resist layer and the substrate by plasma etch processing.

3. A process as recited in claim 1 or claim 2 wherein the layer in which the dye is absorbed is the planarizing layer.

* * * * *

UNITED STATES PATENT AND TRADEMARK OFFICE
CERTIFICATE OF CORRECTION

PATENT NO. : 4,370,405
DATED : January 25, 1983
INVENTOR(S) : Michael M. O'Toole, En-Den D. Liu and Mark S. Chang It is certified that error appears in the above-identified patent and that said Letters Patent are hereby corrected as shown below:

Column 4, line 10, "0.1 W/cm$^2$rf" should read -- 0.1W/cm$^2$rf --; line 16, "0.1 W/cm$^2$rf" should read -- 0.1W/cm$^2$ rf --.

Signed and Sealed this

Twelfth Day of April 1983

[SEAL]

Attest:

GERALD J. MOSSINGHOFF

Attesting Officer

Commissioner of Patents and Trademarks